(12) United States Patent
Saho et al.

(10) Patent No.: US 7,805,831 B2
(45) Date of Patent: Oct. 5, 2010

(54) ELECTRONIC COMPONENTS FEEDING APPARATUS, AND COMPONENTS INFORMATION MANAGING METHOD IN ELECTRONIC COMPONENTS FEEDING APPARATUS

(75) Inventors: Hidehiro Saho, Saga (JP); Hiroyoshi Nishida, Yamanashi (JP)

(73) Assignee: Panasonic Corporation, Osaka (JP)

( * ) Notice: Subject to any disclaimer, the term of this patent is extended or adjusted under 35 U.S.C. 154(b) by 340 days.

(21) Appl. No.: 11/914,457

(22) PCT Filed: May 16, 2006

(86) PCT No.: PCT/JP2006/310089

§ 371 (c)(1),
(2), (4) Date: Nov. 15, 2007

(87) PCT Pub. No.: WO2006/126465

PCT Pub. Date: Nov. 30, 2006

(65) Prior Publication Data

US 2009/0229117 A1    Sep. 17, 2009

(30) Foreign Application Priority Data

| May 23, 2005 | (JP) | ............................. 2005-149061 |
| May 23, 2005 | (JP) | ............................. 2005-149062 |
| May 23, 2005 | (JP) | ............................. 2005-149063 |

(51) Int. Cl.
*B23P 19/00* (2006.01)
(52) U.S. Cl. ............................. 29/739; 29/593; 29/729; 29/740; 29/832; 700/115

(58) Field of Classification Search .................... 29/739, 29/832, 593; 700/114, 115
See application file for complete search history.

(56) References Cited

U.S. PATENT DOCUMENTS 6,157,870 A * 12/2000 Gfeller et al. ................ 700/231
6,332,536 B2 * 12/2001 Easton ..................... 206/459.5

(Continued)

FOREIGN PATENT DOCUMENTS

EP        1 114 576 A1    8/1999

(Continued)

OTHER PUBLICATIONS

Japanese Office Action.

(Continued)

*Primary Examiner*—Derris H Banks
*Assistant Examiner*—Azm Parvez
(74) *Attorney, Agent, or Firm*—Pearne & Gordon LLP

(57) ABSTRACT

A carrier tape package 20 is used in an electronic components placing apparatus for feeding electronic components by a tape feeder, and has a carrier tape 22 housed in a wound state on a tape reel 21. In the carrier tape package 20, a data storage unit 23, in which an IC tag 25 having carrier tape information containing identification information of electronic components P held in the carrier tape 22 is held in a holder 24, is attached to the tape reel 21. At the instant when the carrier tape 22 is mounted in the tape feeder, the carrier tape information is read out by a reader/writer belonging to the tape feeder from the data storage unit 23 mounted on the leading end portion of the tape feeder.

18 Claims, 10 Drawing Sheets

U.S. PATENT DOCUMENTS

| | | | |
|---|---|---|---|
| 6,902,090 B2 * | 6/2005 | Yamamura et al. | 226/32 |
| 7,096,571 B2 * | 8/2006 | Bergstrom | 29/739 |
| 7,273,166 B2 | 9/2007 | Suhara et al. | |
| 2001/0020325 A1 | 9/2001 | Lueckehe | |
| 2004/0039480 A1 * | 2/2004 | Kou | 700/222 |
| 2005/0036274 A1 | 2/2005 | Suhara et al. | |
| 2006/0207089 A1 * | 9/2006 | Maenishi et al. | 29/832 |
| 2008/0147232 A1 * | 6/2008 | Kuribayashi et al. | 700/160 |

FOREIGN PATENT DOCUMENTS

| | | |
|---|---|---|
| JP | 2000-068690 | 3/2000 |
| JP | 2001-320196 A | 11/2001 |
| JP | 2002-525883 A | 8/2002 |
| JP | 2004-165273 A | 6/2004 |
| JP | 2005-101576 | 4/2005 |
| JP | 2005-101576 A | 4/2005 |
| JP | 2006-332089 | 7/2006 |
| JP | 2006-332090 | 7/2006 |

OTHER PUBLICATIONS

Japanese Office Action-2005-149063/Japanese Office Action-2005-149062.

International Search Report Dated Apr. 8, 2006.

* cited by examiner ise. A new system has been
ELECTRONIC COMPONENTS FEEDING APPARATUS, AND COMPONENTS INFORMATION MANAGING METHOD IN ELECTRONIC COMPONENTS FEEDING APPARATUS

TECHNICAL FIELD

The present invention relates to: an electronic components carrier tape package, which is used in an electronic components placement apparatus for feeding electronic components and which houses a carrier tape holding the electronic components, in a state where the carrier tape is wound on a tape reel; an electronic components feeding apparatus, which feeds electronic components to a mounting head, and a components information managing method in the electronic components feeding apparatus; and an electronic components placement apparatus, which takes out electronic components from a components feeding unit by a mounting head and feeds and mounts the electronic components to and on a substrate, and a components information managing method in the electronic components placing apparatus.

BACKGROUND ART

As a method in the electronic components placing apparatus for feeding the electronic components to the mounting head, there has been widely used a method, in which the electronic components are fed to a pickup position of the mounting head by feeding the carrier tape holding the electronic components, pitch by pitch by tape feeder. The carrier tape is handled such that it is wound and housed on the tape reel. At the time of starting a components placing work or in case the components become short during the placing work, a reel mounting work is done by setting the tape reel having the carrier tape wound thereon and housed therein, in the components feeding unit.

Since a number of tape reels having the same shape are mounted in the components feeding unit, the worker may identify the tape reels erroneously in the reel mounting work thereby to cause errors, in which incorrect tape reels are erroneously mounted on the individual tape feeders. In order to prevent such erroneously mounting works, there is known a method (as referred to Patent Document 1), in which bar code labels having identification information written therein on the electronic components held on the carrier tape are adhered to the tape reel so that the bar code labels may be read out for the identification at the time of the reel mounting operations.

Patent Document 1: JP-A-2000-68690

DISCLOSURE OF INVENTION

In the method using the bar code labels as the identification information of the carrier tape, however, the worker has to operate the bar code reader for the reading operations at each time of the reel mounting works. Therefore, the reading mistakes due to the selection of a wrong tape reel cannot be avoided when many tape reels are handled frequently. Moreover, what can be done by the method using the bar code labels is to read the same information written at first, repeatedly so that new information cannot be additionally written. If, therefore, the information on the number of residual components or the fabrication history is to be recorded in the tape reel, the use of which has been interrupted while the unused carrier tape being left, the worker can only write the necessary information by hand in the tape reel. Thus, there has not been established any method efficient and excellent in operability, for managing the components information on the identification and the use history of the electronic components feeding carrier tape which is handled in the prior art while being wound on and housed in the tape reel. A new system has been desired for that management.

Therefore, the present invention has an object to provide an electronic components feeding carrier tape package, in which the components information on the identification and the use history of a carrier tape can be managed efficiently and operably, an electronic components feeding apparatus, a components information managing method in the electronic components feeding apparatus, an electronic components placing apparatus, and a components information managing method in the electronic components placing apparatus.

According to the invention, there is provided an electronic components carrier tape package which is used to feed electronic components in an electronic components placing apparatus which takes out said electronic components from a tape feeder and placing the same on a substrate, and in which a carrier tape holding said electronic components is housed in a state wound on a tape reel. The electronic components carrier tape package comprises: a holder slidably mounted in said carrier tape; and a data storage unit, in which a storage medium which is writable and readable and is written in advance with carrier tape information containing the identification information of electronic components held in said carrier tape, is held in the holder, in that the holder is equipped with a tape inserting portion to which said carrier tape is slidably inserted, and a mounting portion for mounting and holding said holder detachably on said tape feeder. The data storage unit is mounted on the leading end portion of the carrier tape at the instant when at least said carrier tape is mounted on said tape feeder.

According to the invention, moreover, there is provided an electronic components feeding apparatus for feeding electronic components to a mounting head by feeding a carrier tape holding electronic components, as let off a tape reel holding said carrier tape in a wound state, pitch by pitch by a tape feeder. The electronic component feeding apparatus comprises: a holder slidably mounted in said carrier tape, and a data storage unit, in which a storage medium which is writable and readable and is written in advance with carrier tape information containing the identification information of electronic components held in said carrier tape, is held in the holder. The electronic components feeding apparatus further comprises: data reading means arranged in such a tape feed passage for reading data from the storage medium of said data storage unit mounted slidably on said carrier tape let off said tape reel, that said carrier tape is let therethrough into said tape feeder; and read control means for controlling said data reading means to read said carrier tape information.

According to the invention, moreover, there is provided, in an electronic components feeding apparatus for feeding electronic components to a mounting head by feeding a carrier tape holding electronic components, as let off a tape reel holding said carrier tape in a wound state, pitch by pitch by a tape feeder, a components information managing method for managing information on the electronic components held on said carrier tape. The electronic component feeding apparatus includes a holder slidably mounted in said carrier tape, and a data storage unit, in which a storage medium which is writable and readable and is written in advance with carrier tape information containing the identification information of electronic components held in said carrier tape is held in the holder. When said carrier tape is mounted on said tape feeder by holding said tape reel in said reel holding unit, said carrier tape information is read out from the storage medium of said data storage unit slidably mounted on said carrier tape, by data reading means arranged in a tape feed passage, through which said carrier tape is let into said tape feeder.

According to the invention, moreover, there is provided an electronic components placing apparatus for letting said carrier tape off a tape reel holding said carrier tape in a wound state, and feeding the same pitch by pitch by a tape feeder, and for taking out said electronic components from the carrier tape fed pitch by pitch and feeding and mounting the same on a substrate by a mounting head. The electronic components placing apparatus includes a holder slidably mounted in said carrier tape, and a data storage unit, in which a storage medium which is writable and readable and is written in advance with carrier tape information containing the identification information of electronic components held in said carrier tape is held in the holder. The electronic components further placing apparatus comprises: data reading means arranged in such a tape feed passage for reading data from the storage medium of said data storage unit mounted slidably on said carrier tape let off said tape reel, that said carrier tape is let therethrough into said tape feeder; and read control means for controlling said data reading means to read said carrier tape information.

According to the invention, moreover, there is provided, in an electronic components placing apparatus for feeding electronic components to a mounting head by feeding a carrier tape holding electronic components, as let off a tape reel holding said carrier tape in a wound state, pitch by pitch by a tape feeder arrayed in a components feeding unit, and for taking out said electronic components from the carrier tape fed pitch by pitch and feeding and placing the same on a substrate by a mounting head, a components information managing method for managing information on the electronic components held on said carrier tape. The electronic component placing apparatus includes a holder slidably mounted in said carrier tape, and a data storage unit, in which a storage medium which is writable and readable and is written in advance with carrier tape information containing the identification information of electronic components held in said carrier tape is held in the holder. When said carrier tape is mounted on said tape feeder by holding said tape reel in said reel holding unit, said carrier tape information is read out from the storage medium of said data storage unit slidably mounted on said carrier tape, by data reading means arranged in a tape feed passage, through which said carrier tape is let into said tape feeder.

According to the invention, the data storage unit, which can be freely written/read and which holds the storage media having the carrier tape information written therein in advance, is attached to the carrier tape package which houses the carrier tape wound on the tape reel, and carrier tape information is read at the instant when the carrier tape is mounted on the tape feeder, so that the identification information contained in the carrier tape information can be automatically read without any reading mistakes. Moreover, the writing means for writing the data in the storage medium is provided so that the information on the use history can be temporarily written in the storage medium so that the components information on the identification and the use history of the carrier tape can be managed efficiently and operatively.

DESCRIPTION OF REFERENCE NUMERALS AND SIGNS

3 Substrate
4 Parts Feeding Unit
8 Mounting Head
14 Tape Introducing Unit
15 Reader/Writer
20 Carrier Tape Package
21 Tape Reel
22 Carrier Tape
23 Data Storage Unit
24 Holder
24a Tape Inserting Portion
24b Mounting Portion
25 IC Tag
27 Feeder Control Unit
30 Control Unit

BEST MODE FOR CARRYING OUT THE INVENTION

Figure 1:
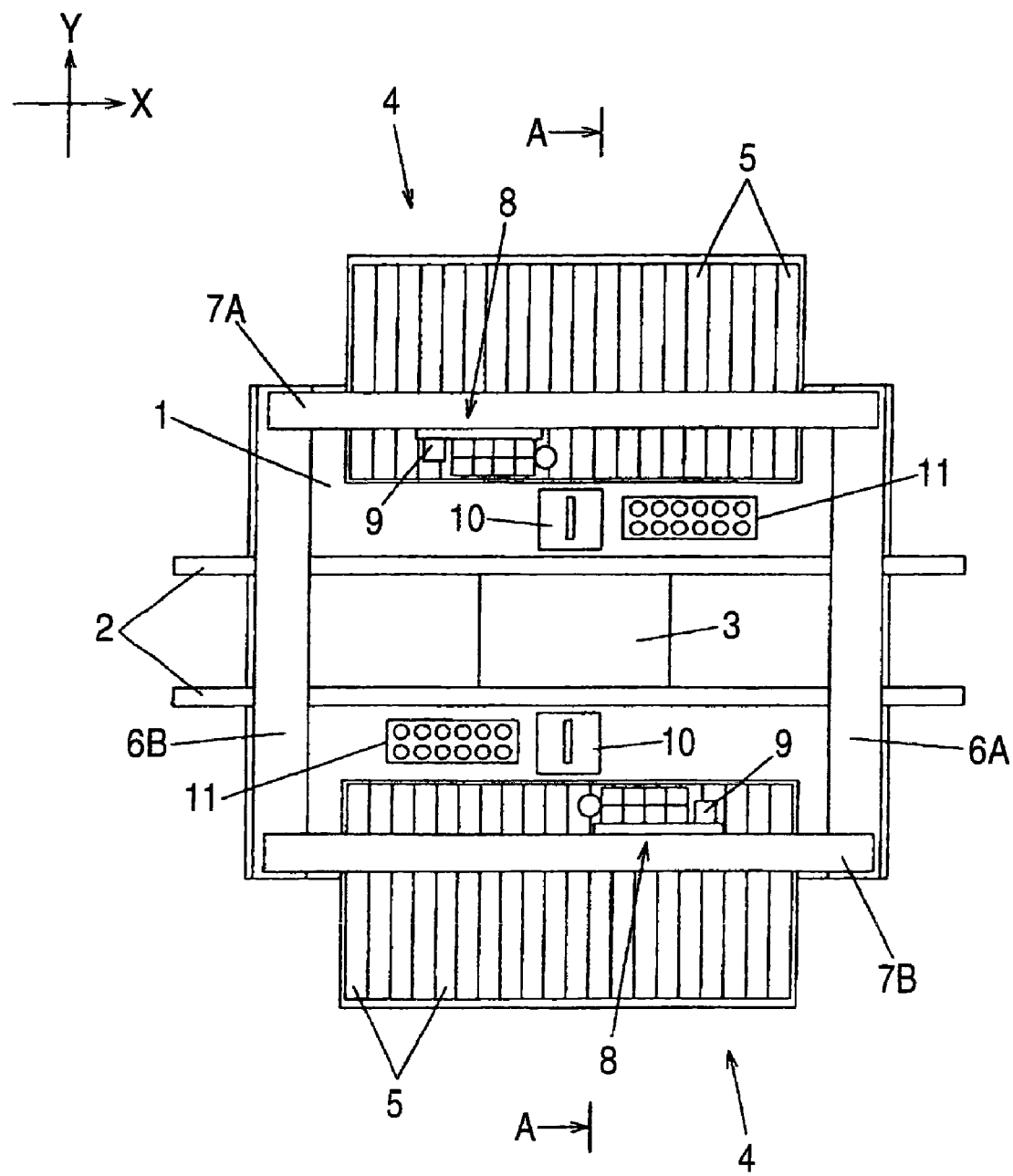
FIG. 1 is a top plan view of an electronic components placement apparatus of one embodiment of the invention.
Figure 2:
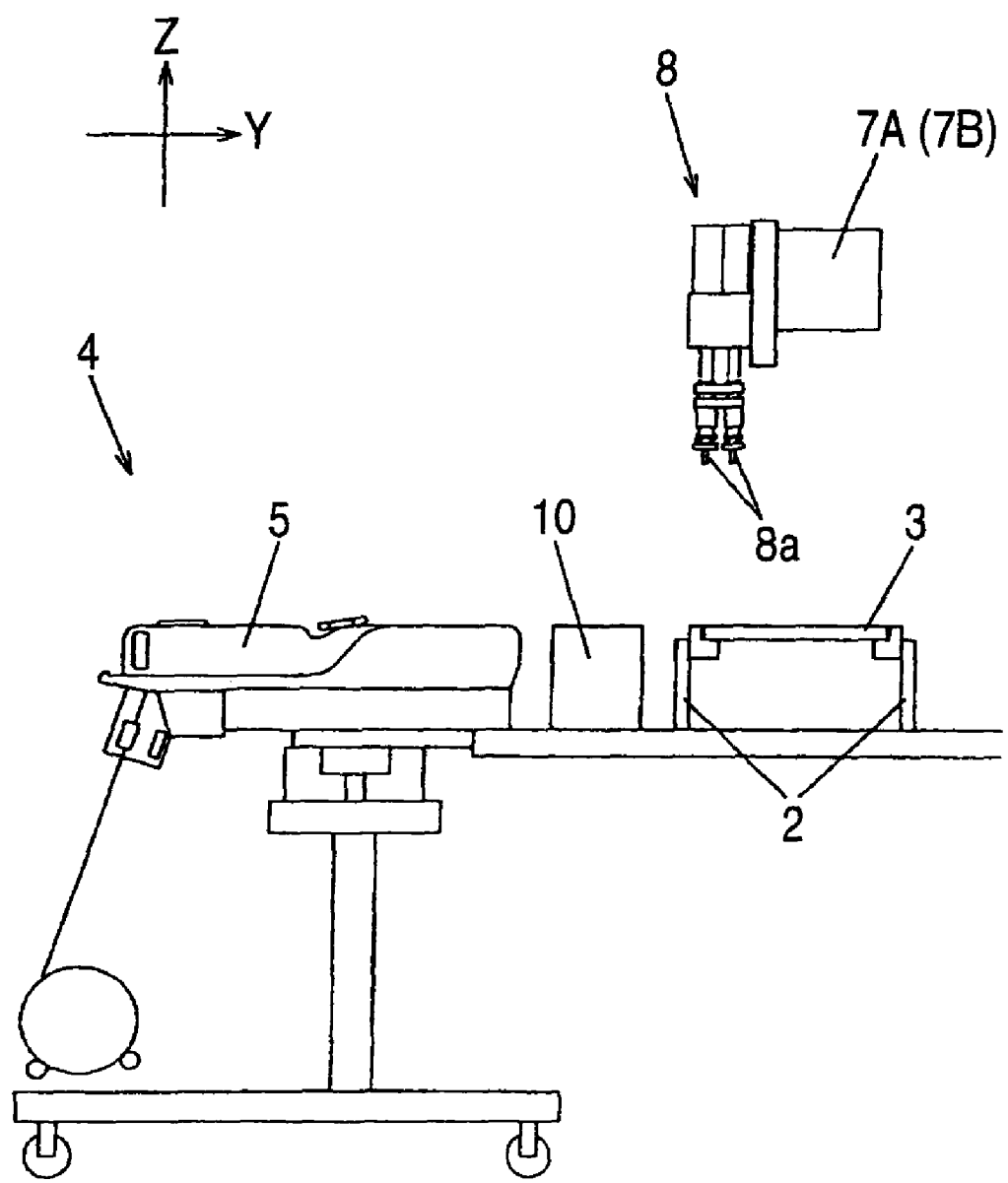
FIG. 2 is a partially sectional view of the electronic components placing apparatus of one embodiment of the invention.
Figure 3:
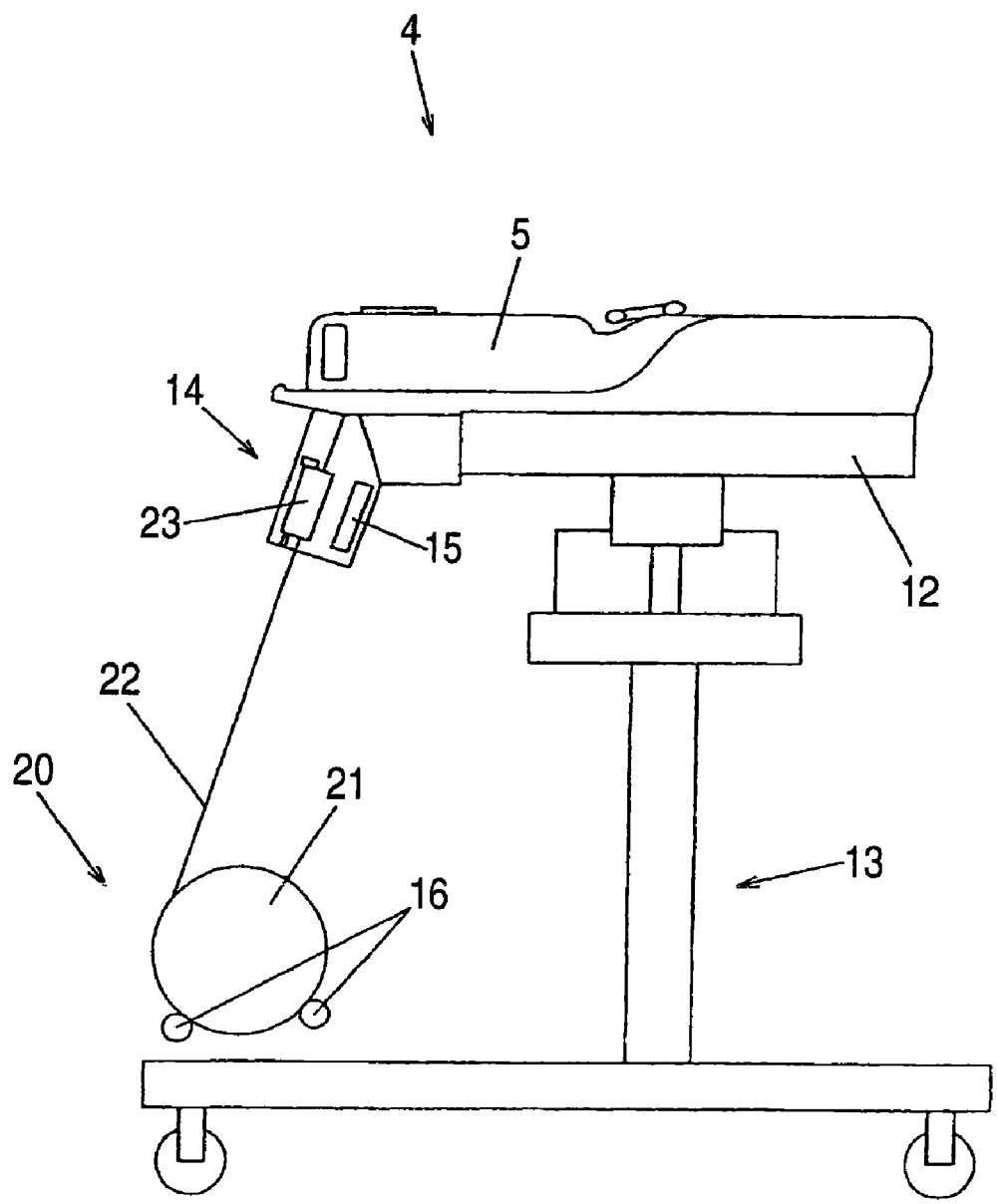
FIG. 3 is a sectional view of a components feeding unit of the electronic components placing apparatus of one embodiment of the invention.
Figure 4:
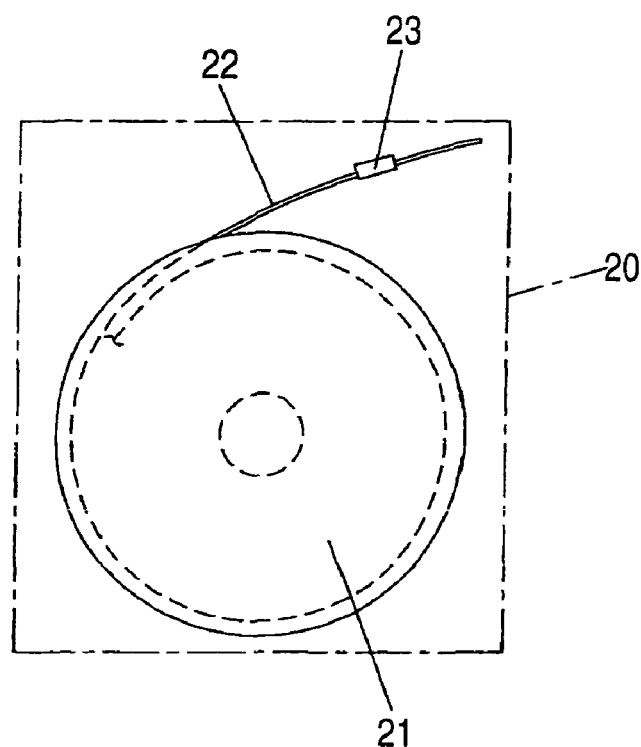
FIGS. 4(a) and 4(b) are views explaining the constitution of a carrier tape package to be used in the electronic components placing apparatus of one embodiment of the invention.
Figure 4:
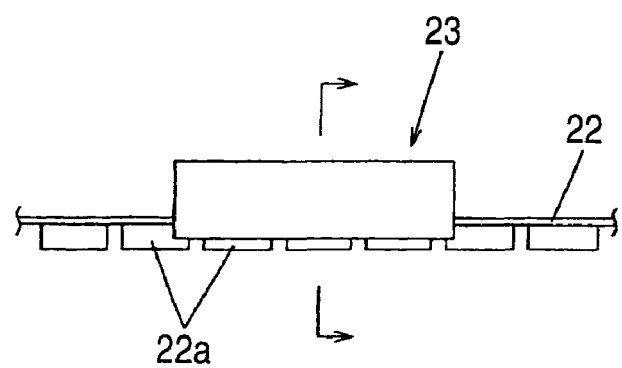
Figure 4:
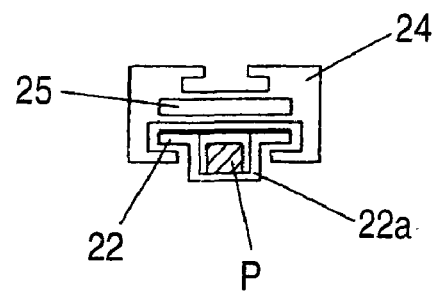
Figure 5:
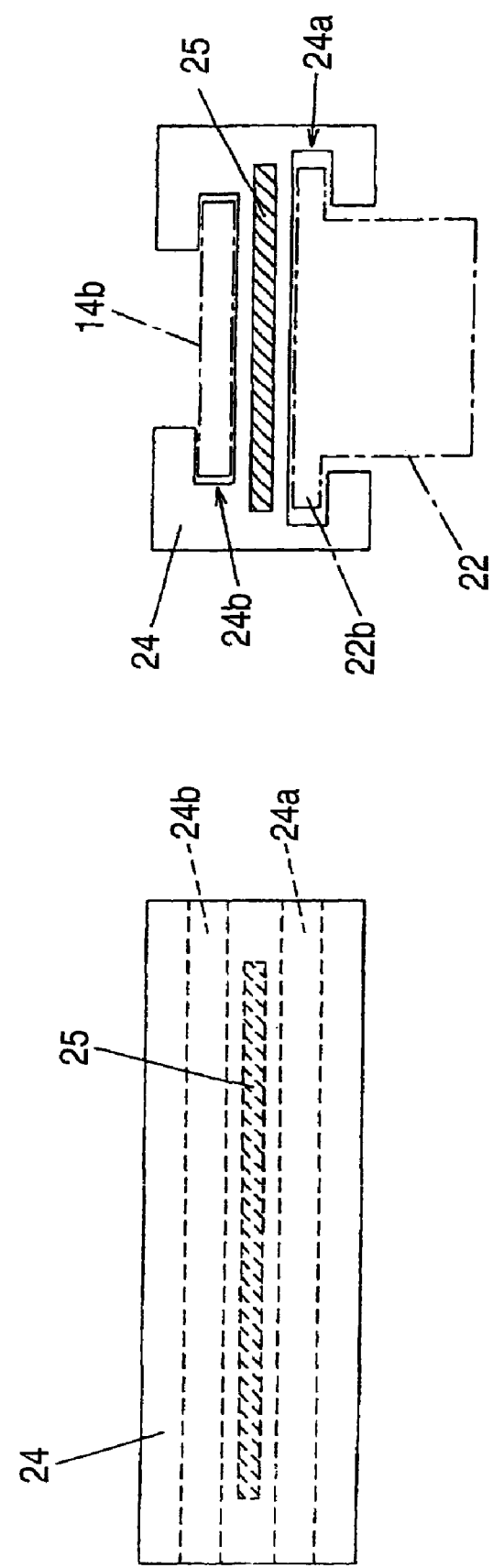
FIG. 5 is a view explaining the constitution of a data storage unit to be used in the electronic components placing apparatus of one embodiment of the invention.
Figure 6:
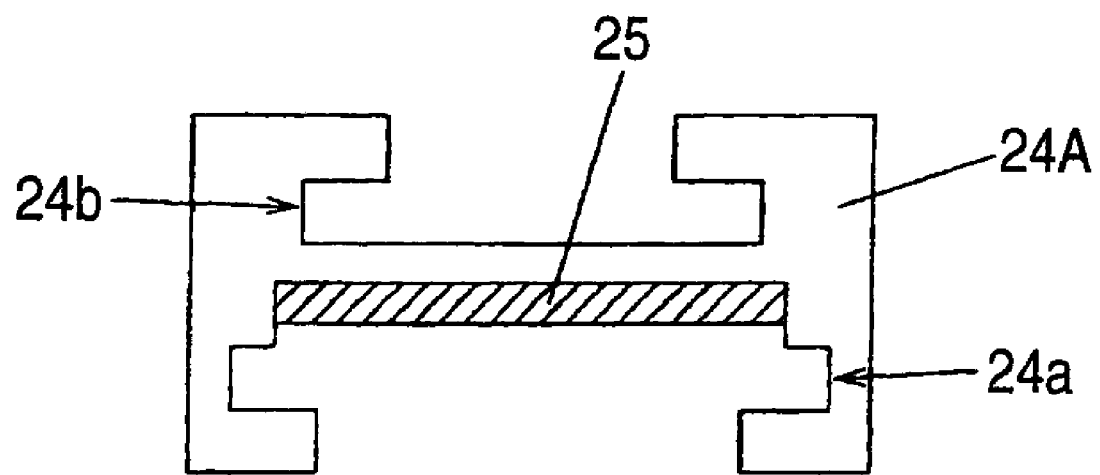
FIG. 6 is a view explaining the constitution of a data storage unit to be used in the electronic components placing apparatus of one embodiment of the invention.
Figure 7:
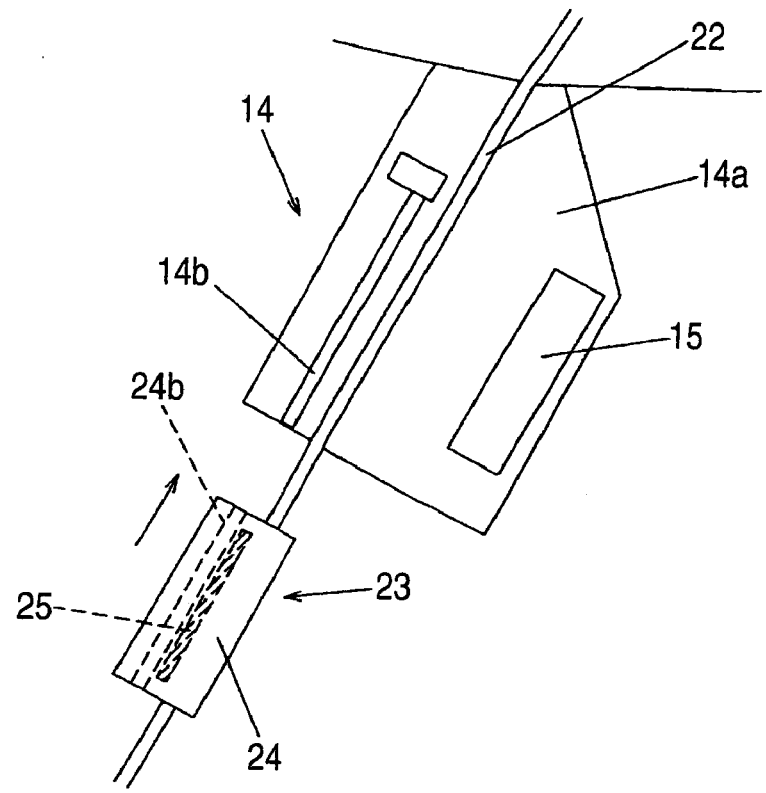
FIGS. 7(a) and 7(b) are views of a method for mounting a data storage unit in the electronic components placing apparatus of one embodiment of the invention.
Figure 7:
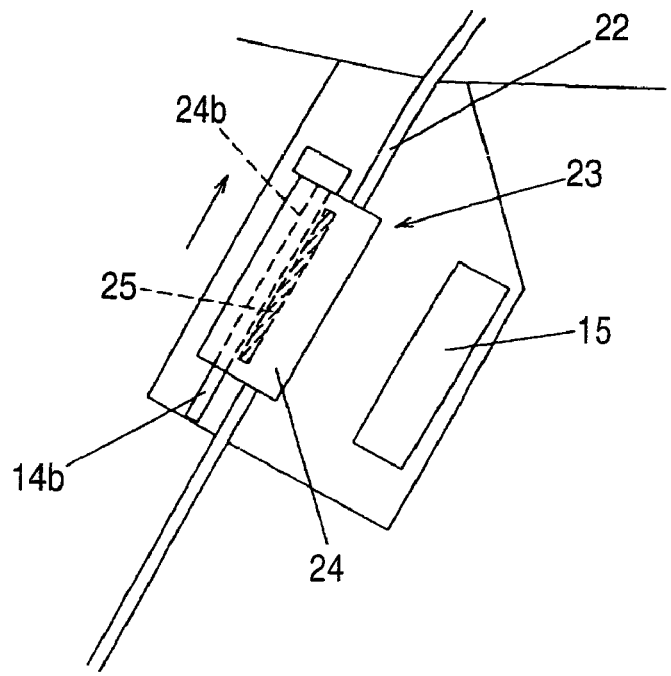
Figure 8:
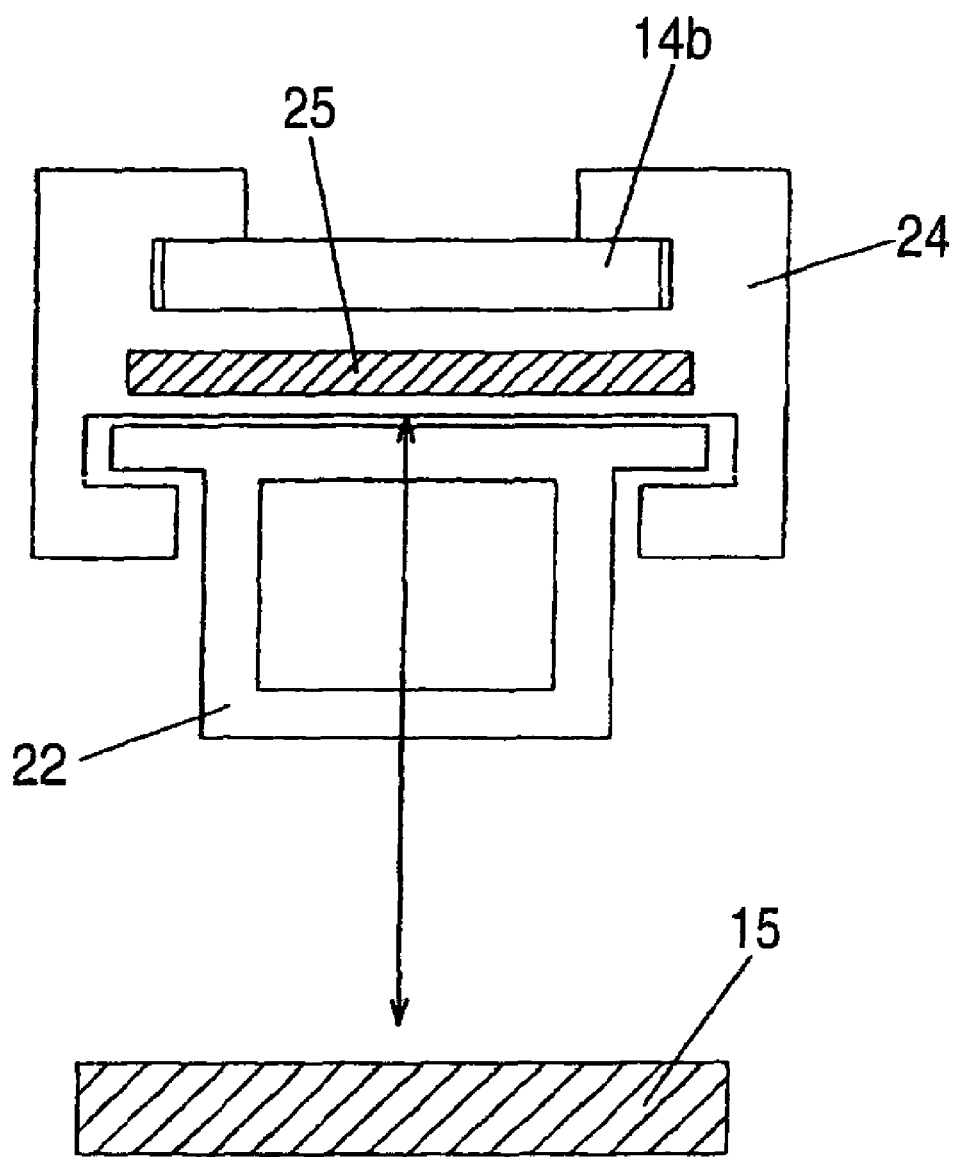
FIG. 8 is an explanatory view of data reading/writing operations of the data storage unit to be used in the electronic components placing apparatus of one embodiment of the invention.
Figure 9:
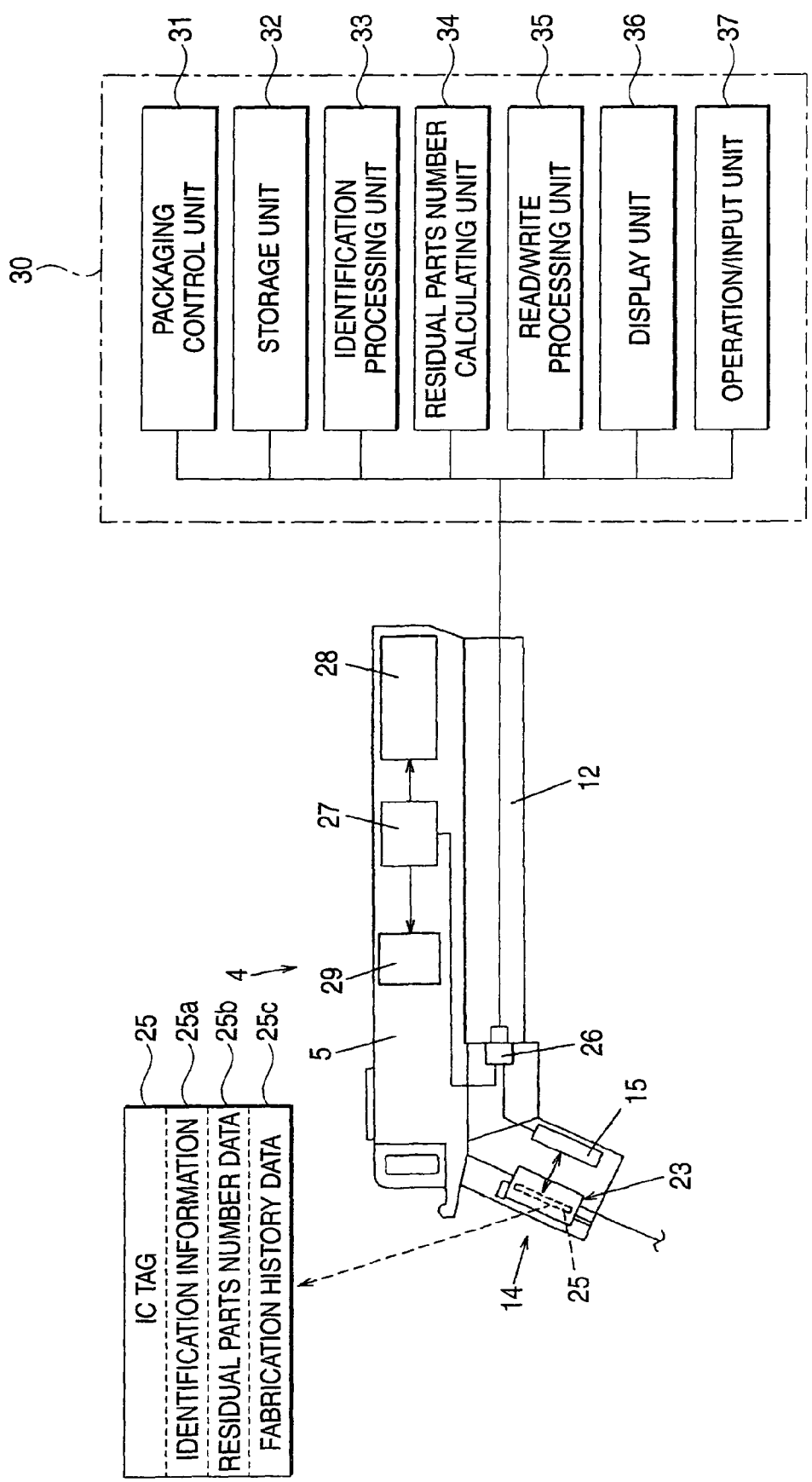
FIG. 9 is a block diagram showing a constitution of a control system of the electronic components placing apparatus of one embodiment of the invention.
Figure 10:
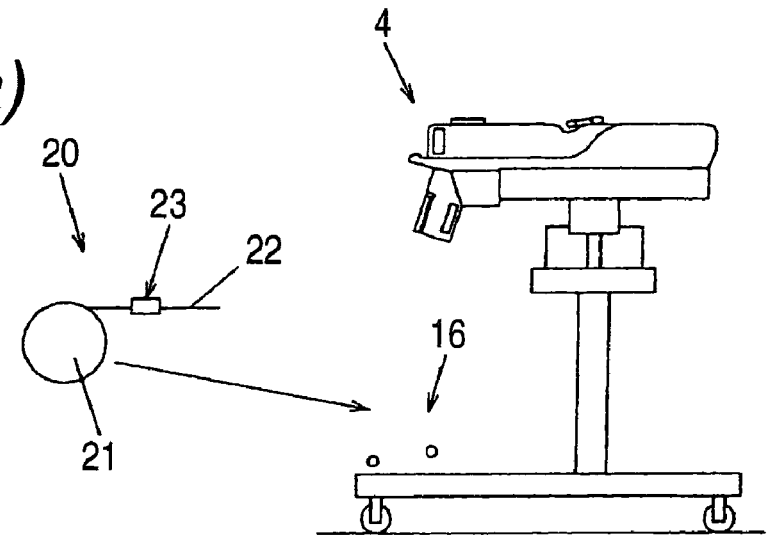
FIGS. 10(a), 10(b) and 10(c) are views explaining a reel mounting method in the electronic components placing apparatus of one embodiment of the invention.
Figure 10:
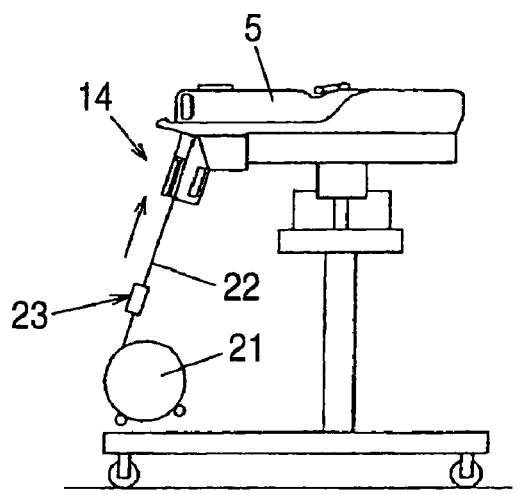
Figure 10:
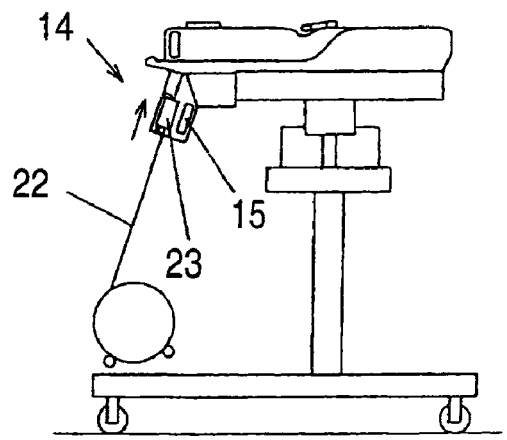

Embodiments of the invention are described with reference to the drawings. FIG. 1 is a top plan view of an electronic components placement apparatus of one embodiment of the invention; FIG. 2 is a partially sectional view of the electronic components placing apparatus of one embodiment of the invention; FIG. 3 is a sectional view of a components feeding unit of the electronic components placing apparatus of one embodiment of the invention; FIG. 4 presents views explaining the constitution of a carrier tape package to be used in the electronic components placing apparatus of one embodiment of the invention; FIG. 5 and FIG. 6 are views explaining the constitution of a data storage unit to be used in the electronic components placing apparatus of one embodiment of the invention; FIG. 7 presents views of a method for mounting a data storage unit in the electronic components placing apparatus of one embodiment of the invention; FIG. 8 is an explanatory view of data reading/writing operations of the data storage unit to be used in the electronic components placing apparatus of one embodiment of the invention; FIG. 9 is a block diagram showing a constitution of a control system of the electronic components placing apparatus of one embodiment of the invention; and FIG. 10 presents views explaining a reel mounting method in the electronic components placing apparatus of one embodiment of the invention.

At first, a structure of an electronic components placing apparatus is described with reference to FIG. 1 and FIG. 2. FIG. 2 shows a section A-A in FIG. 1 partially. In FIG. 1, transfer passages 2 are arranged in an X-direction (a substrate transferring direction) at the center of a base 1. The transfer passages 2 transfer a substrate 3 delivered from the upstream side, and position it on a placing step. On the two sides of the transfer passages 2, there are arranged components feeding units 4, in which a plurality of tape feeders 5 are juxtaposed to each other. These tape feeders 5 feed the electronic components by feeding the carrier tape holding the electronic components, pitch by pitch.

On the two end portions of the upper face of the base 1, there are arranged Y-axis tables 6A and 6B, over which two X-axis tables 7A and 7B are erected. The X-Axis table 7A is moved horizontally in the Y-Axis direction by driving the Y-axis table 6A, and the X-axis table 7B is moved horizontally in the Y-axis direction by driving the Y-axis table 6B. On the X-axis tables 7A and 7B, respectively, there are mounted mounting heads 8, and substrate recognizing cameras 9 which move integrally with the mounting heads 8.

By driving the Y-axis table 6A, the X-axis table 7A, the Y-axis table 6B and the X-axis table 7B in combination, the mounting heads 8 move horizontally to pick up the electronic components from their individual components feeding units 4 by suction nozzles 8a (as referred to FIG. 2) and to mount them on the substrate 3 positioned in the transfer passages 2. The substrate recognizing cameras 9 moved onto the substrate 3 recognize the substrate 3 by taking its image. Parts recognizing cameras 10 and nozzle holding units 11 are arranged in the route from the components feeding units 4 to the transfer passages 2.

The mounting heads 8 having taken the electronic components from the components feeding units 4 carry, when they move to the substrate 3 positioned at the placing stage, the electronic components held by the suction nozzles 8a, in the X-direction over the components recognizing cameras 10. Thus, the components recognizing cameras 10 take the images of the electronic components held by the suction nozzles 8a. Moreover, the image taking results are recognized by the (not-shown) recognition processing units so that not only the positions of the electronic components held by the suction nozzles 8a but also the kinds of the electronic components are identified. The nozzle holding units 11 accommodate a plurality of kinds of suction nozzles 8a at predetermined positions, and the mounting heads 8 access to the nozzle holding units 11 to perform the nozzle exchanging actions, so that the nozzles are exchanged in the mounting heads 8 in accordance with the kinds of the target electronic components.

The structure of the components feeding unit 4 is described with reference to FIG. 3. The components feeding unit 4 is equipped with a feeder base 12 for mounting the plural tape feeders 5. Each tape feeder 5 is arranged at the components feeding unit 4 by a feeder mounting carriage 13. The carriage 13 is equipped with a reel holding unit 16 for holding a tape reel 21 housing a carrier tape 22 in a wound state. The reel holding unit 16 is equipped with holding rollers for holding the tape reel 21 rotatably, so that the carrier tape 22 can be let off by rotating the tape reels 21 arranged in the components feeding unit 4.

The tape feed passage, into which the carrier tape let off the tape reel 21 is let by the tape feeder 5, is equipped with a tape introducing unit 14 attached to each tape feeder 5. In the tape introducing unit 14, there is arranged a reader/writer 15 for reading/writing data from/into a later-described data storage 23. The carrier tape 22 let into the tape feeder 5 is fed pitch by pitch by a tape feed mechanism built in the tape feeder 5 so that it is sequentially fed to the let-off position by the mounting heads 8. From the carrier tape 22 thus fed pitch by pitch, the electronic components are let off and mounted on the substrate 3 by the mounting head 8. In other words, the tape feeder 5 having the tape reel 21 set at the components feeding unit 4 becomes an electronic components feeding apparatus for feeding the mounting head 8 with the electronic components held by the carrier tape 22.

With reference to FIG. 4, here is described a carrier tape package 20 having the carrier tape 22 formed into the tape reel 21. As shown in FIG. 4(b), a plurality of embossed portions 22a are formed at a constant pitch on one face of the carrier tape 22. As shown in FIG. 4(b), electronic components P are held in the embossed portions 22a. The carrier tape 22 is cut to a predetermined length, and is then housed in a wound state in the tape reel 21. The tape reel 21 is handled in such a packaged shape that a plurality of units are housed in a box- or bag-shaped container, and is fed in this state to the electronic components placing line.

The data storage unit 23 is so attached to the carrier tape package 20 as is held near the leading end portion of the carrier tape 22. The data storage unit 23 is constituted, as shown in FIG. 4(b), such that an IC tag 25 is held by a holder 24 made of a resin. The IC tag 25 is a sheet-shaped electronic storage device, in which a readable/writable microminiature semiconductor memory is contained, so that it can write/read data in a non-contact manner. In the IC tag 25, there is written in advance the data such as carrier tape information, which contains information for identifying the electronic components held in the carrier tape 22.

Here, the data storage unit 23 belongs one-to-one to the tape reel 21. In this embodiment, the maker supplies the carrier tape package 20 in the state where the data storage unit 23 is mounted in advance in the carrier tape 22. The data storage unit 23 can be attached in various modes to the carrier tape package 20 by the method of retaining the one-to-one correspondence, such as by a method of adhering the data storage unit 23 to the container of the carrier tape package 20 without being mounted on the carrier tape 22. In short, the corresponding relation between the data storage unit 23 and the carrier tape 22 may be retained in the state where the carrier tape 22 is mounted on the tape feeder 5. In other words, the data storage unit 23 may be mounted on the leading end portion of the carrier tape 22 at the instant when at least the tape reel 21 is set on the components feeding unit 4 so that the carrier tape 22 is mounted on the tape feeder 5.

With reference to FIG. 5, here is described the detailed structure of the data storage unit 23. The holder 24 is fabricated by molding a resin into a generally rectangular block shape, and is integrally buried in the holder 24. On one face side (as located on the lower face side of FIG. 5) of the holder 24, a tape inserting portion 24a having a sectional shape to slide a base tape portion 22b of the carrier tape 22 thereinto is formed therethrough in the longitudinal direction. By inserting the base tape portion 22b of the carrier tape 22 into the tape inserting portion 24a, the holder 24 is slidably mounted on the carrier tape 22.

The holder 24 is equipped, on the side opposite to the face having the tape inserting portion 24a, with a mounting portion 24b for mounting and holding the holder 24 removably in the tape introducing portion 14. When a new tape reel 21 is set in the components feeding unit 4, the carrier tape 22 is pulled into the tape feeder 5 through the tape introducing unit 14, as shown in FIG. 7(a), and the data storage unit 23 is mounted on the tape introducing unit 14.

The tape introducing unit 14 is constituted by equipping a plate member 14a with a fitted plate 14b, which is so sectionally shaped as can be fitted on the aforementioned reader/write 15 and the mounting portion 24b. When the data storage unit 23 is mounted, the fitted plate 14b is positioned with the mounting portion 24b formed in the holder 24, and the holder 24 is slid along the fitted plate 14b, as shown in FIG. 7(b), to fit the fitted plate 14b in the mounting portion 24b. As a result, the mounting of the data storage unit 23 in the tape introducing unit 14 is completed so that the data storage unit 23 confronts the reader/writer 15. In this state, moreover, the carrier tape 22 freely slides in the tape inserting portion 24a so that its pitch feed is not obstructed.

Here, the fitting portion for fitting and holding the holder 24 detachably in the tape introducing unit 14 should not be limited to the sectional shape, in which the fitted plate 14b is fitted, but can use a variety of mechanisms/shapes. For example, the holder 24 may be retained on the plate member 14a either by a retaining mechanism of a combination of a pin and a pin hole or by a one-touch type clamp mechanism.

FIG. 8 shows the state, in which the data storage unit 23 is mounted. Specifically, the holder 24 is held in position by the fitted plate 14b. In this state, the IC tag 25 held by the holder 24 is positionally held in a predetermined position/spacing with respect to the reader/writer 15 so that the data can be read/written by the reader/writer 15. In other words, the reader/writer 15 is constituted to include data reading means for reading data from the IC tag 25 of the data storage unit 23 mounted slidably on the carrier tape 22, and data writing means for writing the data in the IC tag 25. Here, the constitution of the data storage unit may also be made not by burying the IC tag 25 integrally in the holder 24 but by constituting a data storage unit 23A with a holder 24A having a structure, in which the IC tag 25 is jointed and held by an adhesive, as shown in FIG. 6.

With reference to FIG. 9, here is described the constitution of a control system. FIG. 9 shows only that control system of the electronic components placing apparatus, which relates to a components feed system for taking out the electronic components from the components feeding unit 4 and feeds them to the mounting head 8. In FIG. 9, each tape feeder 5 is equipped with a feeder control unit 27, which controls the actions of a tape feed mechanism 28 and a cover tape discharge mechanism 29. The tape feed mechanism 28 feeds the carrier tape 22 let into the tape feeder 5, pitch by pitch. The cover tape discharge mechanism 29 is a mechanism for feed back the cover tape, which is separated short of the take-out position of the electronic components by the mounting head 8 from the carrier tape 22, backward of the tape feeding direction.

Each tape feeder 5 is equipped with an externally connecting connector 26, which is connected with a control unit 30 of the electronic components placing apparatus body by mounting the tape feeder 5 on the feeder base 12. The feeder control unit 27 and the reader/writer 15 are connected into the connector 26 so that they are connected with the control unit 30 by mounting the tape feeder 5 in the components feeding unit 4.

The IC tag 25 of the data storage unit 23 is set with a storage area for writing identification information 25a, a residual components number data 25b and fabrication history data 25c. The identification information 25a relates to the electronic components stored in the carrier tape 22 concerned, and contains components codes, maker names, fabrication dates and fabrication lot numbers.

The residual components number data 25b indicates the residual components number of the case, in which the user of the carrier tape 22 wound and housed by the tape reel 21 is interrupted while the carrier tape 22 is consumed its midway. The residual components number is calculated by subtracting the number of consumed components from the previously known total number of the housed components. The method of calculating the number of consumed components may be based on either the pitch feed number by the tape feeder 5 or the take-out number by the mounting head 8.

The fabrication history data 25c indicates the history, in which the tape reel 21 concerned has been mounted and used for the fabrication, that is, specifies the date of use, and the mounting work line/apparatus mounted. The fabrication history data 25c is used together with the identification information 25a to retain the traceability at the subsequent steps.

The control unit 30 is equipped with a placing control unit 31, a storage unit 32, an identification processing unit 33, a residual components number calculating unit 34, a read/write processing unit 35, a display unit 36 and an operation/input unit 37. The placing control unit 31 controls the actions of the components placing mechanism for moving the mounting head 8 and the actions of the tape feeder 5 by outputting an action command to the feeder control unit 27. The storage unit 32 is stored with various kinds of data such as programs for executing the various processing actions such as the placing actions, placing data to be used for executing the actions, or reference data for deciding the propriety of the carrier tape 22 with reference to the identification information 25a.

The identification processing unit 33 compares the identification information 25a contained in the carrier data information read from the IC tag 25 by the reader/writer 15, with the aforementioned reference data stored in the storage unit 32, thereby to decide the propriety of the carrier tape 22 mounted at that time by the tape feeder 5, that is, whether or not the carrier tape 22 concerned is the normal carrier tape 22 for feeding the correct components. In short, the identification processing unit 33 acts as identification means for identifying the propriety of the carrier tape 22 concerned, on the basis of the identification information contained in the carrier tape information read.

On the basis of the data on the action number of the mounting head 8, the residual components number calculating unit 34 calculates the number of residual components of the tape reel 21 at each timing, that is, the number of components wound on the tape reel 21 held while being unused in the carrier tape 22. Therefore, the residual components number calculating unit 34 acts as residual components number calculating means for calculating the number of residual components in the tape reel 21.

The read/write processing unit 35 processes the reading operation of data from the IC tag 25 by the reader/writer 15, and the writing operation of the data in the IC tag 25. In this embodiment, moreover, the read/write processing unit 35 is equipped with: read control means for controlling the reader/writer 15 to read the carrier tape information from the IC tag 25; write control means for writing the information on the carrier tape in the IC tag 25; and write control means for controlling the reader/writer 15 to write the information on the carrier tape 22 housed in the tape reel 21, in the IC tag 25.

Moreover, the read/write processing unit 35 causes the reader/writer 15 to write the data on the number of residual components calculated by the residual components number calculating unit 34, in the IC tag 25. The display unit 36 is a display device for displaying an input command for the operations and an operation screen at the inputting time, and displays the identification results by the identification processing unit 33. The operation/input unit 37 is input means such as a keyboard or a touch panel for inputting operations and data.

FIG. 10 shows the working actions at the time of the electronic components placing apparatus, when the new carrier tape package 20 is mounted on the components feeding unit 4. When a new carrier tape 22 is mounted on the tape feeder 5, the tape reel 21 having the carrier tape 22 wound thereon is placed and held in the reel holding unit 16, as shown in FIG. 10(a). At this time, the data storage unit 23 attached to the tape reel 21 is mounted on the leading end portion of the carrier tape 22.

When the tape reel 21 is placed on the reel holding unit 16, the leading end portion of the carrier tape 22 is pulled through the tape introducing unit 14 into the tape feeder 5, as shown in FIG. 10(b). At this time, the data storage unit 23 is slid downstream (upward) along the carrier tape 22 to fit the mounting portion 24b of the holder 24 in the fitted plate 14b of the tape introducing unit 14. As a result, the data storage unit 23 is set, as shown in FIG. 10(c), at the portion to confront the reader/writer 15, so that the state shown in FIG. 8 is established.

When the read/write processing unit 35 controls the reader/writer 15 in this state, the carrier tape information written in advance in the IC tag 25, that is, the information, as needed at this time, of the identification information 25a, the residual components number data 25b and the fabrication history data 25c is read out. If the identification information read is identified by the identification processing unit 33 to decide that the carrier tape 22 holds the normal components, the placing actions are started. If it is decided that the normal components are not held, on the contrary, this decision is displayed in the display unit 36, and the apparatus actions are stopped.

In the procedure to repeat the placing actions, i.e., the actions, in which the carrier tape 22 is sequentially let off from the tape reel 21 by the tape feeder 5 and fed pitch by pitch to the take-out position of the electronic components by the mounting head 8, the residual components number calculation is executed. Specifically, the residual components at the timing of the tape reel 21 concerned are calculated in real time by counting the number of the transferring and placing actions by the mounting head 8 or the pitch-feeding actions by the tape feeder 5, with the residual components number calculating unit 34, and by subtracting the number of components consumed by those actions from the total number of housed components.

At a predetermined timing (e.g., at the interruption of the operation of the apparatus or at the time of switching the apparatus kind) set as the data writing timing, moreover, the calculated number of residual components is written in the IC tag 25 by the reader/writer 15. As a result, the residual components of the tape reel 21 are always stored in the IC tag 25 of the data storage unit 23 attached to each tape reel 21. When the operation of the apparatus is interrupted to demount the tape reel 21, the aforementioned fabrication history data 25c is written in the IC tag 25. This fabrication history data 25c is referred to, in case the components fed from the same tape reel 21 have to be traced when a trouble due to the components failure is discovered at a later step.

When this tape reel 21 is used again, the data storage unit 23 is mounted in the tape introducing unit 14, and the residual components number data 25b is read from the IC tag 25, so that the control unit 30 of the electronic components placing apparatus can start the placing actions while grasping the residual components of the tape reel 21. It is, therefore, possible to predict the timing, at which the components in the tape feeder 5 having the tape reel 21 mounted thereon become short, thereby to prevent the apparatus from being stopped due to an abrupt components shortage.

At the time of mounting the aforementioned carrier tape package 20, more specifically, when the carrier tape 22 is to be mounted on the tape feeder 5 while the tape reel 21 being held on the reel holding unit 16, the carrier tape information is read from the IC tag 25 of the data storage unit 23 by the reader/writer 15 arranged in the tape feed passage, through which the carrier tape 22 let off the tape reel 21 is let into the tape feeder 5. On the basis of the identification information 25a contained in the carrier tape information read, moreover, it is identified whether or not the carrier tape concerned is proper. In the procedure to execute the placing actions, moreover, the processing of writing the data on the number of residual components in the take reel concerned, in the IC tag 25 is executed.

Here in the embodiment thus far described, the control unit 30 of the electronic components placing apparatus controls the reader/writer 15 to read the data from the IC tag 25 and to write the data in the IC tag 25 thereby to identify the carrier tape 22 and to calculate the number of residual components of the tape reel 21. However, these functions may also be handed to the individual tape feeders 5.

As shown in FIG. 9, specifically, the functions of the identification processing unit 33, the residual components number calculating unit 34 and the read/write processing unit 35 can be given to the feeder control unit 27. Independently of the control functions of the electronic components placing apparatus, therefore, the components information managements such as the identification of the carrier tape 22, the calculation of the number of residual components and the update of the residual components number data to be written in the IC tag 25 can be performed solely by the tape feeder 5. In this modification, the feeder control unit 27 attached to a components feeding device acts as the data read control means, the data write control means and the residual components number calculating means thus far described.

In this embodiment, as has been described hereinbefore, the data storage unit 23 equipped with the IC tag 25 capable of freely reading/writing data is attached to the carrier tape package 20 for feeding the carrier tape 22 holding the electronic components. As a result, as compared with the method of the prior art using the bar code label as the identification information of the carrier tape, the worker need not read at each reel mounting work by operating the bar code reader, so that the occurrence of a reading mistake, as might otherwise be caused by a mix-up of the tape reel, can be reliably prevented.

Since new information can be written in the IC tag 25, moreover, the information on the residual components number or the fabrication history at the instant, when the use of the tape reel 21 is interrupted while leaving the unused carrier tape, can be automatically recorded in the data storage unit 23 belonging to each tape reel 21. As a result, the components information on the identification or use history of the carrier tape for feeding the electronic components to be handled while being wound on and housed in the tape reel can be managed by the method efficient and excellent in operability.

This application is based upon and claims the benefit of priorities of Japanese Patent Application Nos. 2005-149061, 2005-149062, 2005-149063, all filed on May 23, 2005, the contents of which are incorporated herein by reference in its entirety.

INDUSTRIAL APPLICABILITY

The carrier tape package of this invention has an advantage that the components information on the identification and the use history of the carrier tape can be managed efficiently and operably, and is useful in the electronic components placing field of the mode, in which the components feed is performed by the carrier tape.

The invention claimed is:

1. An electronic components feeding apparatus for feeding electronic components to a mounting head by feeding a carrier tape holding electronic components, as let off a tape reel holding said carrier tape in a wound state, pitch by pitch by a tape feeder, said electronic component feeding apparatus comprising:
   a holder slidably mounted in said carrier tape;
   a data storage unit, in which a storage medium is writable and readable and is written in advance with carrier tape information containing the identification information of electronic components held in the holder;
   data reading means confronting with the storage medium and arranged in such a tape feed passage for reading data from the storage medium of said data storage unit mounted slidably on said carrier tape let off said tape reel, that said carrier tape is let therethrough into said tape feeder; and
   read control means for controlling said data reading means to read said carrier tape information,
   wherein said storage medium includes an IC tag, said holder is equipped with a tape inserting portion to which said carrier tape is slidably inserted, and a mounting portion for mounting and holding said holder detachably on said tape feeder by fitting a fitting plate with the mounting portion so that the IC tag is opposite to said data reading means.

2. An electronic components feeding apparatus as set forth in claim 1, further comprising identification means for identifying the propriety of said carrier tape on the basis of the identification information contained in said carrier tape information read.

3. An electronic components feeding apparatus as set forth in claim 1, further comprising:
   data writing means arranged together with said data reading means for writing the data in said storage means; and
   write control means for controlling said data writing means to write the information on the carrier tape housed in said tape reel, in said storage medium.

4. An electronic components feeding apparatus as set forth in claim 3, wherein said said data reading means and said data writing means are a reader-and-writer of the IC tag.

5. An electronic components feeding apparatus as set forth in claim 3, further comprising residual components number calculating means for calculating the number of residual components in said tape reel; and
   wherein said write control means controls said write control means to write said residual components number in said storage medium.

6. In an electronic components feeding apparatus for feeding electronic components to a mounting head by feeding a carrier tape holding electronic components, as let off a tape reel holding said carrier tape in a wound state, pitch by pitch by a tape feeder, in that a data storage unit, in which a storage medium is writable and readable and is written in advance with carrier tape information containing the identification information of electronic components held in said carrier tape is held in a holder slidably mounted in said carrier tape, is attached to said carrier tape; a components information managing method for managing information on the electronic components held on said carrier tape, the method comprising the steps of:
   reading out said carrier tape information from the storage medium of said data storage unit slidably mounted on said carrier tape, by data reading means arranged in a tape feed passage, through which said carrier tape is let into said tape feeder, when said carrier tape is mounted on said tape feeder by holding said tape reel in said reel holding unit; and
   identifying the propriety of said carrier tape on the basis of the identification information contained in said carrier tape information read,
   wherein said storage medium includes an IC tag, said holder is equipped with a tape inserting portion to which said carrier tape is slidably inserted, and amounting portion for mounting and holding said holder detachably on said tape feeder by fitting a fitting plate with the mounting portion so that the IC tag is opposite to said data reading means.

7. A components information managing method in an electronic components feeding apparatus as set forth in claim 6, further comprising a step of writing the data on the residual components number in said tape reel in said storage medium by data writing means arranged in the tape feed passage.

8. An electronic components placing apparatus for letting said carrier tape off a tape reel holding said carrier tape in a wound state, and feeding the same pitch by pitch by a tape feeder, and for taking out said electronic components from the carrier tape fed pitch by pitch and feeding and placing the same on a substrate by a mounting head,
   a holder slidably mounted in said carrier tape;
   a data storage unit, in which a storage medium which is writable and readable and is written in advance with carrier tape information containing the identification information of electronic components held in said carrier tape is held in is attached to said carrier tape;
   data reading means confronting with the storage medium and arranged in such a tape feed passage for reading data from the storage medium of said data storage unit mounted slidably on said carrier tape let off said tape reel, that said carrier tape is let therethrough into said tape feeder; and
   read control means for controlling said data reading means to read said carrier tape information,
   wherein said storage medium includes an IC tag, said holder is equipped with a tape inserting portion to which said carrier tape is slidably inserted, and a mounting portion for mounting and holding said holder detachably on said tape feeder by fitting a fitting plate with the mounting portion so that the IC tag is opposite to said data reading means.

9. An electronic components placing apparatus as set forth in claim 8, further comprising identification means for identifying the propriety of said carrier tape on the basis of the identification information contained in said carrier tape information read.

10. An electronic components placing apparatus as set forth in claim 8, further comprising:
    data writing means arranged together with said data reading means for writing the data in said storage means; and write control means for controlling said data writing means to write the information on the carrier tape housed in said tape reel, in said storage medium.

11. An electronic components placing apparatus as set forth in claim 10, wherein said data reading means and said data writing means are a reader/writer of the IC tag.

12. An electronic components placing apparatus as set forth in claim 10, further comprising residual components number calculating means for calculating the number of residual components in said tape reel; and
    wherein said write control means controls said write control means to write said residual components number in said storage medium.

13. An electronic components feeding apparatus as set forth in claim 1, wherein said data reading means is arranged in a tape feed passage through which said carrier tape is pulled into said tape feeder.

14. A components information managing method in an electronic components feeding apparatus as set forth in claim 6, wherein said data reading means is arranged in a tape feed passage through which said carrier tape is pulled into said tape feeder.

15. An electronic components placing apparatus as set forth in claim 8, wherein said data reading means is arranged in a tape feed passage through which said carrier tape is pulled into said tape feeder.

16. An electronic components feeding apparatus as set forth in claim 1, wherein said data reading means is arranged in a tape introducing unit of said tape feed passage through which a leading end portion of said carrier tape is pulled into said tape feeder.

17. A components information managing method in an electronic components feeding apparatus as set forth in claim 6, wherein said data reading means is arranged in a tape introducing unit of said tape feed passage through which a leading end portion of said carrier tape is pulled into said tape feeder.

18. An electronic components placing apparatus as set forth in claim 8, wherein said data reading means is arranged in a tape introducing unit of said tape feed passage through which a leading end portion of said carrier tape is pulled into said tape feeder.

* * * * *